(12) United States Patent
Hiramatsu et al.

(10) Patent No.: US 11,732,360 B2
(45) Date of Patent: Aug. 22, 2023

(54) FILM FORMING APPARATUS (71) Applicant: Toshiba Mitsubishi-Electric Industrial Systems Corporation, Chuo-ku (JP)

(72) Inventors: Takahiro Hiramatsu, Tokyo (JP); Hiroyuki Orita, Tokyo (JP); Nobuyoshi Namito, Tokyo (JP); Yusuke Iwao, Tokyo (JP)

(73) Assignee: Toshiba Mitsubishi-Electric Industrial Systems Corporation, Chuo-ku (JP)

( * ) Notice: Subject to any disclaimer, the term of this patent is extended or adjusted under 35 U.S.C. 154(b) by 130 days.

(21) Appl. No.: 16/630,959

(22) PCT Filed: Feb. 28, 2019

(86) PCT No.: PCT/JP2019/007748
§ 371 (c)(1),
(2) Date: Jan. 14, 2020

(87) PCT Pub. No.: WO2020/174642
PCT Pub. Date: Sep. 3, 2020

(65) Prior Publication Data
US 2021/0230748 A1 Jul. 29, 2021

(51) Int. Cl.
*C23C 16/54* (2006.01)
*C23C 16/56* (2006.01)
(Continued)

(52) U.S. Cl.
CPC ...... *C23C 16/4582* (2013.01); *C23C 16/0209* (2013.01); *C23C 16/482* (2013.01);
(Continued)

(58) Field of Classification Search
None
See application file for complete search history.

(56) References Cited

U.S. PATENT DOCUMENTS 2,236,398 A * 3/1941 Drummond ............. F26B 21/14
34/60
4,261,808 A 4/1981 Walter
(Continued)

FOREIGN PATENT DOCUMENTS

| CN | 102615010 A | 8/2012 |
| JP | 55-54569 A | 4/1980 |
| WO | WO 2017/068625 A1 | 4/2017 |

OTHER PUBLICATIONS

International Search Report dated May 7, 2019 in PCT/JP2019/007748 filed on Feb. 28, 2019, 2 pages.
(Continued)

*Primary Examiner* — Karla A Moore
(74) *Attorney, Agent, or Firm* — Oblon, McClelland, Maier & Neustadt, L.L.P.

(57) ABSTRACT

Inside a heating space of a heating chamber, a first heating treatment of moving a substrate along a substrate moving direction is performed by a first conveyor. After that, first conveyance processing of moving the substrate along a conveying direction is performed by a second conveyor. At this time, source mist is sprayed on the substrate by first thin film forming nozzles. Subsequently, second heating treatment is performed by a third conveyor. After that, second conveyance processing is performed by a fourth conveyor. At this time, source mist is sprayed on the substrate by second thin film forming nozzles.

9 Claims, 3 Drawing Sheets (51) Int. Cl.
  *B05B 9/00* (2006.01)
  *C23C 16/458* (2006.01)
  *C23C 16/02* (2006.01)
  *C23C 16/48* (2006.01)
  *H01L 31/18* (2006.01)
  *B05D 1/02* (2006.01)
  *B05D 3/02* (2006.01)
  *C23C 16/455* (2006.01)

(52) U.S. Cl.
  CPC .............. *C23C 16/54* (2013.01); *C23C 16/56* (2013.01); *B05B 9/00* (2013.01); *B05D 1/02* (2013.01); *B05D 3/0227* (2013.01); *B05D 3/0263* (2013.01); *C23C 16/45574* (2013.01); *H01L 31/18* (2013.01)

(56) References Cited

U.S. PATENT DOCUMENTS

| | | | | | |
|---|---|---|---|---|---|
| 4,678,169 | A | * | 7/1987 | Fishman | H05K 3/0085 118/503 |
| 4,913,090 | A | * | 4/1990 | Harada | C23C 16/455 118/724 |
| 5,113,701 | A | * | 5/1992 | Martin | H05K 13/0061 118/58 |
| 5,637,148 | A | * | 6/1997 | Kuster | B05C 13/02 118/64 |
| 6,319,326 | B1 | * | 11/2001 | Koh | H01J 37/317 118/718 |
| 2005/0167404 | A1 | * | 8/2005 | Yamazaki | H01L 21/67155 257/292 |
| 2012/0269226 | A1 | * | 10/2012 | Parks | F27D 5/0037 373/113 |

OTHER PUBLICATIONS

Extended European Search Report dated Jan. 14, 2021 in European Patent Application No. 19832537.5, 8 pages.
Japanese Office Action dated Aug. 18, 2020 in Japanese Application 2019-550260 (with English Translation), 4 pages.
Written opinion of the International Search Report dated May 7, 2019 in PCT/JP2019/007748 (with English translation), 9 pages.
Combined Taiwanese Office Action and Search Report dated Nov. 17, 2020 in Patent Application No. 108147848 (with English machine translation), 8 pages.
Office Action dated Feb. 21, 2022, in Chinese Application No. 201980017252.6 (w/English-language translation), 17 pages.
Office Action dated Jun. 29, 2022, in Korean Patent Application No. 10-2020-7027841 w/English-language Translation.

* cited by examiner

FILM FORMING APPARATUS

TECHNICAL FIELD

The present invention is used in manufacture of an electronic apparatus such as a solar battery, and relates to a film forming apparatus that forms a film on a substrate.

BACKGROUND ART

As a method of forming a film on a substrate, the chemical vapor deposition (CVD) method has been known. However, the chemical vapor deposition method often requires film formation in a vacuum, and thus a large vacuum chamber, as well as a vacuum pump etc., needs to be used. Further, in the chemical vapor deposition method, there has been a problem in that using a substrate having a large area as a substrate to be subjected to film formation is difficult from a point of view of costs or the like. In view of this, a misting method, which enables film forming treatment in atmospheric pressure, has been drawing attention.

As a conventional technology related to a film forming apparatus using such a misting method, for example, there is a technology according to Patent Document 1.

In the technology according to the Patent Document 1, atomized source solution and reaction material are sprayed from a source solution ejection port and a reaction material ejection port that are provided on a bottom surface of a mist spray head unit including a mist spray nozzle etc. to a substrate disposed in an atmosphere. With such spraying, a film is formed on the substrate. Note that the reaction material refers to a material that contributes to a reaction with the source solution.

A conventional film forming apparatus typified in Patent Document 1 forms a thin film on the substrate by simultaneously performing mist spraying treatment of a thin film forming nozzle and heating treatment of a heating mechanism.

Further, generally, a heating mechanism is provided inside a substrate placing stage that allows a substrate to be placed on its upper surface, and this substrate placing stage is used as a flat heating means.

PRIOR ART DOCUMENTS

Patent Documents

Patent Document 1: WO 2017/068625 A1

SUMMARY

Problem to be Solved by the Invention

As described above, generally, a conventional film forming apparatus has the following configuration. Specifically, a heating mechanism is provided inside a substrate placing stage that allows a substrate, which is a material as an object to be subjected to film formation, to be placed on its upper surface, and this substrate placing stage is used as a flat heating means.

When a flat heating means such as the substrate placing stage is used, heating treatment for a substrate is performed by bringing an upper surface of the substrate placing stage and a lower surface of a substrate to come in contact with each other and causing heat to transfer between the substrate placing stage and the substrate.

However, when a substrate has such a structure that a lower surface of the substrate is curved or a lower surface has a recessed portion and a projecting portion, instead of having a flat plate-like shape, the flat heating means allows an upper surface of the substrate placing stage and a back surface of the substrate to only locally come in contact with each other. Therefore, there have been problems in that heating of the substrate is uneven when heating treatment is performed by a heating mechanism, and a substrate is warped and deformed, for example.

The present invention has an object to solve the problems as described above, and provide a film forming apparatus that can form, a thin film on a substrate and can enhance throughput of film forming treatment, without reducing film forming quality and a film forming rate.

Means to Solve the Problem

A film forming apparatus according to the present invention includes first and second heating chambers, and first and second heating moving mechanisms. The first and second heating chambers include first and second heating spaces. The first and second heating moving mechanisms are provided in the first and second heating spaces. The first heating moving mechanism performs first heating treatment by moving a substrate in a first direction inside the first heating space, and the second heating moving mechanism performs second heating treatment by moving the substrate in a second direction inside the second heating space. The film forming apparatus further includes a conveyance moving mechanism, and a mist spraying mechanism. The conveyance moving mechanism is configured to perform conveyance processing of moving the substrate along a conveying direction, to thereby cause the substrate to pass through a film forming path outside the first and second heating chambers, and convey the substrate between the first and second heating chambers. The mist spraying mechanism is configured to perform mist spraying treatment of spraying source mist toward the substrate passing through the film forming path. The source mist is obtained by atomizing a source solution. After at least one heating treatment of the first and second heating treatments is performed, a thin film is formed on the substrate by performing the mist spraying treatment with the mist spraying mechanism.

Effects of the Invention

The film forming apparatus of an invention of the present application according to claim 1 performs the first and second heating treatments by moving the substrate in the first and second directions inside the first and second heating spaces. Therefore, the substrate can be uniformly heated, irrespective of the shape of the substrate.

In the film forming apparatus of an invention of the present application according to claim 1, each of the first and second heating chambers, and the film forming path provided outside the first and second heating chambers are disposed separately from each other. Therefore, the mist spraying treatment does not adversely affect the first and second heating treatments.

Therefore, the film forming apparatus of an invention of the present application according to claim 1 can form a thin film on the substrate, without reducing film forming quality and a film forming rate.

Further, the film forming apparatus of an invention of the present application according to claim 1 performs the mist spraying treatment on the substrate passing through the film forming path while the film forming apparatus performs the conveyance processing of moving the substrate between the first and second heating chambers. As a result, the film forming, apparatus can efficiently perform the mist spraying treatment.

These and other objects, features, aspects and advantages of the present invention will become more apparent from the following detailed description of the present invention when taken in conjunction with the accompanying drawings.

DESCRIPTION OF EMBODIMENTS

Basic Art

It is considered that, as a heating mechanism, an infrared radiation apparatus may be used instead of a conventional flat heating means. By using the infrared radiation apparatus, direct heating can be achieved with infrared light being electromagnetic waves, without touching a substrate. Therefore, uniform heating can be achieved, irrespective of the shape of a substrate.

However, there has been a problem. Specifically, source mist, which is obtained by atomizing a source solution, absorbs infrared light and the source mist is thereby heated and evaporated, causing reduction in film forming quality of a thin film formed on a substrate and a film forming rate in film forming treatment. Further, there has been another problem. Specifically, mist spraying treatment itself of spraying source mist hinders heating of a substrate.

To solve these problems, an improved manufacturing method is conceived. In the improved manufacturing method, a heating process and a film forming process (mist spraying process) are separated from each other, and are performed in different spaces. By using this improved manufacturing method, irrespective of the shape of a substrate, film formation is enabled without reducing film forming quality of a thin film and a film forming rate in film forming treatment.

However, a temperature of a substrate sharply drops immediately after the substrate goes through a heating process, and thus the heating process and the film forming process need to be repeated. Therefore, a first method is conceived. In the first method, a plurality of heating mechanisms that perform heating treatment and a plurality of mist spraying mechanisms that perform mist spraying treatment are prepared, and the plurality of (a large number of) heating mechanisms and the plurality of (a large number of) mist spraying mechanisms are alternately arrayed. Further, a second method is conceived. In the second method, a substrate between a single heating mechanism and a single mist spraying mechanism is caused to move backward and forward a plurality of times.

Figure 3:
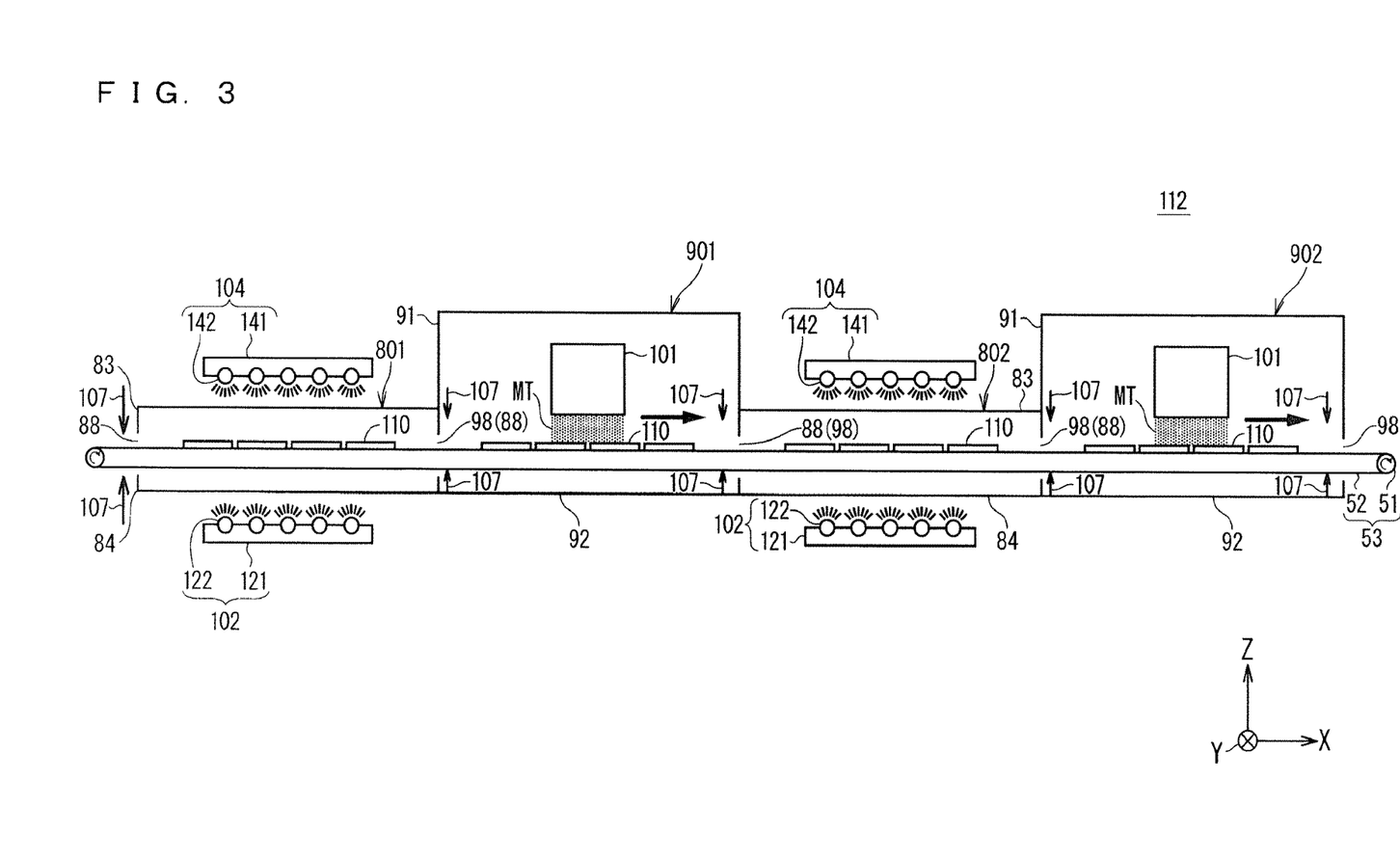
FIG. 3 is an explanatory diagram illustrating a schematic configuration of a film forming apparatus of basic art of the present invention.

FIG. 3 is an explanatory diagram illustrating a schematic configuration of a film forming apparatus that embodies the first method of the basic art of the present invention. An XYZ orthogonal coordinate system is illustrated in FIG. 3.

As illustrated in FIG. 3, a thin film manufacturing apparatus 112 of the basic art includes, as its main components, heating chambers 801 and 802, film forming chambers 901 and 902, two thin film forming nozzles 101, combinations of two pairs of infrared radiation apparatuses 102 and 104, and a conveyor 53.

The infrared radiation apparatus 102 consists of a lamp placing table 121 and a plurality of infrared lamps 122. The plurality of infrared lamps 122 are attached to an upper portion of the lamp placing table 121. Therefore, the infrared radiation apparatus 102 can radiate infrared light upward (+Z direction) from the plurality of infrared lamps 122. With the above-mentioned infrared radiation of the infrared radiation apparatus 102, heating treatment (first direction heating treatment) for a back surface of a plurality of substrates 110 placed on an upper surface of a belt 52 can be performed.

The infrared radiation apparatus 104 consists of a lamp placing table 141 and a plurality of infrared lamps 142. The plurality of infrared lamps 142 are attached to a lower portion of the lamp placing table 141. Therefore, the infrared radiation apparatus 104 can radiate infrared light downward (−Z direction) from the plurality of infrared lamps 142. With the above-mentioned infrared radiation of the infrared radiation apparatus 104, heating treatment (second direction heating treatment) for a front surface of a plurality of substrates 110 placed on an upper surface of the belt 52 can be performed.

The conveyor 53 being a substrate conveying unit allows a plurality of substrates 110 to be placed on an upper surface of the belt 52, and conveys the plurality of substrates 110 in a conveying direction (X direction). The conveyor 53 includes a pair of rollers 51 for conveyance provided at both right and left ends, and an endless belt 52 for conveyance that is stretched across the pair of rollers 51.

With rotational drive of the pair of rollers 51, the conveyor 53 can move, an upper side (+Z direction side) of the belt 52 along the conveying direction (X direction).

Of the pair of rollers 51 of the conveyor 53, one roller is provided on the left side (−X direction) out of the heating chamber 801, and the other roller is provided on the right side (+X direction) of the film forming chamber 902. Further, a center portion of the belt 52 is provided inside any of the heating chamber 801, the heating chamber 802, the film forming chamber 901, and the film forming chamber 902.

Therefore, with rotational drive of the pair of rollers 51, the belt 52 can be moved between the inside of the heating chambers 801 and 802, the inside of the film forming chambers 901 and 902, and the outside, through a pair of opening portions 88 provided at a portion of respective side surfaces on the right and left (−X direction, +X direction) of the heating chambers 801 and 802 and a pair of opening portions 98 provided at a portion of respective side surfaces on the right and left of the film forming chambers 901 and 902.

The heating chambers 801 and 802 and the film forming chambers 901 and 902 are adjacently provided from the left side to the right side in the order of the heating chamber 801, the film forming chamber 901, the heating chamber 802, and the film forming chamber 902. Further, the right opening portion 88 of the heating chamber 801 and the left opening portion 98 of the film forming chamber 901 are shared. The right opening portion 98 of the film forming chamber 901 and the left opening portion 88 of the heating chamber 802 are shared. The right opening portion 88 of the heating chamber 802 and the left opening portion 98 of the film forming chamber 902 are shared.

A part of the conveyor 53 is accommodated in the heating chambers 801 and 802. The configuration inside and around the heating chambers 801 and 802 are the same, and thus the heating chamber 801 will be mainly described below.

The heating chamber 801 consists of an upper chamber 83, a lower chamber 84, and a pair of opening portions 88. The pair of opening portions 88 is located between the upper chamber 83 and the lower chamber 84 in a height direction being the Z direction. Therefore, the conveyor 53 provided between the opening portions 88 and 88 in the heating chamber 201 is disposed at a position higher than the lower chamber 84, and at a position lower than the upper chamber 83.

In an area around the heating chamber 801, the infrared radiation apparatus 102 being a first direction heating unit is fixed at a position apart from the conveyor 53 on a lower side (−Z direction) side out of the lower chamber 84 by a fixing means (not shown).

In an area around the heating chamber 801, the infrared radiation apparatus 104 being a second direction heating unit is fixed at a position apart from the conveyor 53 on an upper side (+Z direction) side out of the upper chamber 83 by a fixing means (not shown). The infrared radiation apparatus 102 and the infrared radiation apparatus 104 constitute a heating mechanism.

Note that both of the infrared radiation apparatuses 102 and 104 are disposed at positions overlapping an upper surface area (area interposed between a pair of linear conveyor chains) of the belt 52 in the heating chamber 801 in plan view.

As a material, each of the heating, chambers 801 and 802 uses an infrared light transmitting material that has an excellent transmitting property and that does not absorb infrared light radiated from the infrared radiation, apparatuses 102 and 104. Specifically, as a material, each of the heating chambers 801 and 802 uses quartz glass.

The infrared radiation apparatus 102 being a first direction heating unit performs first direction heating treatment of heating the substrate 110 from a back surface side, by radiating infrared light from a back surface side (another main surface side) of the substrate 110 toward the +Z direction (first direction).

The infrared radiation apparatus 104 being a second direction heating unit performs second direction heating treatment of heating the substrate 110 from a front surface side, by radiating infrared light from a front surface side (one main surface side) of the substrate 110 toward the −Z direction (second direction) being a direction opposite to the +Z direction.

Further, the heating chamber 801 accommodates the substrate 110 in its inside, when the heating treatment (first direction heating treatment and second direction heating treatment) of the infrared radiation apparatuses 102 and 104 is performed.

The heating chamber 801 closes the opening portions 88 between the upper chamber 83 and the lower chamber 84 with an air curtain 107 when heating treatment is performed. In this manner, a plurality of substrates 110 placed on the belt 52 can be insulated from the outside.

As described above, the thin film manufacturing apparatus 112 of the basic art includes the infrared radiation apparatuses 102 and 104 provided around the outside of the heating chamber 801 as a first heating mechanism, and the infrared radiation apparatuses 102 and 104 provided around the outside of the heating apparatus 802 as a second heating mechanism.

Further, first heating treatment is performed by the infrared radiation apparatuses 102 and 104 for a plurality of substrates 110 in the heating chamber 801, and second heating treatment is performed by the infrared radiation apparatuses 102 and 104 for a plurality of substrates 110 in the heating chamber 802. These first and second heating treatments include the first direction heating treatment and the second direction heating treatment, respectively.

Each of the film forming chambers 901 and 902 accommodates the thin film forming nozzle 101 and a part of the conveyor 53. The internal configurations of the film forming chambers 901 and 902 are the same, and thus the film forming chamber 901 will be mainly described below.

The heating chamber 901 consists of an upper chamber 91, a lower chamber 92, and a pair of opening portions 98. The pair of opening portions 98 is located between the upper chamber 91 and the lower chamber 92 in the height direction being the Z direction. Therefore, the conveyor 53 provided between the opening portions 98 and 98 in the film forming chamber 901 is disposed at a position higher than the lower chamber 92, and at a position lower than the upper chamber 91.

In the film forming chamber 901, the thin film forming nozzle 101 being a mist spraying mechanism is fixedly disposed in the upper chamber 91 by a fixing means (not shown). In this case, the thin film forming nozzle 101 is disposed to have such a positional relationship that a spray surface and an upper surface of the belt 52 face each other.

In the film forming chamber 901, the thin film forming nozzle 101 performs mist spraying treatment of spraying source mist MT downward (−Z direction) from a spray port provided on a spray surface.

As described above, the thin film manufacturing apparatus 112 of the basic art includes the thin film forming nozzle 101 provided in the film forming chamber 901 as a first mist spraying mechanism, and the thin film forming nozzle 101 provided in the film forming chamber 902 as a second mist spraying mechanism.

Further, first mist spraying treatment is performed by the thin film forming nozzle 101 provided in the film forming chamber 901, and second mist spraying treatment is performed by the thin film forming nozzle 101 provided in the film forming chamber 902.

Each of the film forming chambers 901 and 902 closes the opening portions 98 between the upper chamber 91 and the lower chamber 92 with an air curtain 107 when mist spraying treatment is performed. In this manner, the thin film forming nozzle 101 and a plurality of substrates 110 placed on the belt 52 can be insulated from the outside.

Therefore, when the thin film manufacturing apparatus 112 of the basic art uses the air curtain 107 to close all of the pair of opening portions 88 of respective heating chambers 801 and 802 and the pair of opening portions 98 of respective film forming chambers 901 and 902, and moves the belt 52 of the conveyor 53 along the conveying direction (X direction), the thin film manufacturing apparatus 112 of the basic art can set a film forming environment.

In the thin film manufacturing apparatus 112 of the basic art, combinations of the two pairs of infrared radiation apparatuses 102 and 104 and the two thin film forming nozzles 101 are disposed separately from each other, so that heating treatment performed for the substrate 110 in the heating chambers 801 and 802 and mist spraying treatment performed for the substrate 110 in the film forming chambers 901 and 902 are not affected by each other in the film forming environment.

Then, in the thin film manufacturing apparatus 112 of the basic art, in the film forming environment, the first heating treatment of infrared radiation of the infrared radiation apparatuses 102 and 104 is performed for a plurality of substrates 110 in the heating chamber 801. Subsequently, the first mist spraying treatment of the thin film forming nozzle 101 is performed in the film forming chamber 901.

After that, in the thin film manufacturing apparatus 112, in the film forming environment, the second heating treatment of infrared radiation of the infrared radiation apparatuses 102 and 104 is performed for a plurality of substrates 110 in the heating chamber 802. Subsequently, the second mist spraying treatment of the thin film forming nozzle 101 is performed in the film forming chamber 902.

As a result, the thin film manufacturing apparatus 112 of the basic art can finally form a thin film on a surface of the substrate 110 placed on an upper surface of the belt 52 in the film forming chamber 902.

As described above, the thin film manufacturing apparatus 112 of the basic art can heat the substrate 110 with combinations of the two pairs of infrared radiation apparatuses 102 and 104, without touching the substrate 110. Therefore, the thin film manufacturing apparatus 112 of the basic art can perform uniform heating, irrespective of the shape of the substrate 110, without deforming the substrate 110.

Further, in the thin film manufacturing apparatus 112 of the basic art, the two pairs of infrared radiation apparatuses 102 and 104 and the two thin film forming nozzles 101 are disposed separately from each other, so that the heating treatment and the mist spraying treatment are not affected by each other. Therefore, the thin film manufacturing apparatus 112 can securely avoid occurrence of the source mist evaporation phenomenon, when each of the first and second heating treatments and the first and second mist spraying treatments is performed.

As a result, the thin film manufacturing apparatus 112 of the basic art can form a thin film on a surface of the substrate 110, without reducing film forming quality and a film forming rate.

As described above, in the thin film manufacturing apparatus 112 of the basic art, the first and second heating mechanisms and the first and second mist spraying mechanisms are alternately disposed in the order of first and second, so that the first and second heating treatments and the first and second mist spraying treatments are not affected by each other.

Further, the thin film manufacturing apparatus 112 of the basic art has a feature in that the first and second heating treatments and the first and second mist spraying, treatments are alternately performed in the order of first and second.

Therefore, the thin film manufacturing apparatus 112 of the basic art can increase the thickness of a formed thin film, and can form a thin film with a stacking structure consisting of two films having different film qualities, by performing the heating treatment and the mist spraying treatment alternately repeated twice.

Note that, in the thin film manufacturing apparatus 112 described above, a combination of two heating mechanisms and two mist spraying mechanisms is illustrated. However, an extended modification, which is achieved by a combination of n (n≥2) heating mechanisms and n mist spraying mechanisms, can be implemented.

The extended modification includes first to n-th heating mechanisms that perform first to n-th heating treatments, and first to n-th mist spraying mechanisms that perform first to n-th mist spraying treatments.

In the extended modification, the first to n-th heating mechanisms and the first to n-th mist spraying mechanisms are alternately disposed separately from each other in the order of first to n-th, so that the first to n-th heating treatments and the first to n-th mist spraying treatments are not affected by each other.

Further, the extended modification has a feature in that the first to n-th heating treatments and the first to n-th mist spraying treatments are alternately performed in the order of first, second, . . . , n-th.

Therefore, the extended modification can increase the thickness of a formed thin film, and can form a thin film with a stacking structure consisting of films of n layers having different film qualities, by performing the heating treatment and the mist spraying treatment alternately repeated n (≥2) times.

In addition, the thin film manufacturing apparatus 112 of the basic art simultaneously perform the first direction heating treatment of the infrared radiation apparatus 102 and the second direction heating treatment of the infrared radiation apparatus 104, as the first and second heating treatments performed for the substrate 110 in the heating chambers 801 and 802.

As a result, the thin film manufacturing apparatus 112 of the basic art can more uniformly heat the substrate 110 in each of the heating chambers 801 and 802.

However, in the first method typified by the basic art as illustrated in FIG. 3, there has been a problem. Specifically, a plurality of infrared radiation apparatuses 102 and 104 being heating, mechanisms and a plurality of thin film forming nozzles 101 being mist spraying mechanisms need to be provided, which increases costs.

In contrast, the second method has the following problem. Specifically, when movement is caused between a single heating mechanism and a single mist spraying mechanism, wasteful time in which neither the heating treatment nor the mist spraying treatment is performed is invariably generated, which reduces throughput of film forming treatment.

Embodiments to be described below have an object to solve the problems of the first and second methods, minimize the number of heating mechanisms and mist spraying mechanisms, and enhance throughput of film forming treatment.

Embodiment (Configuration)

Figure 1:
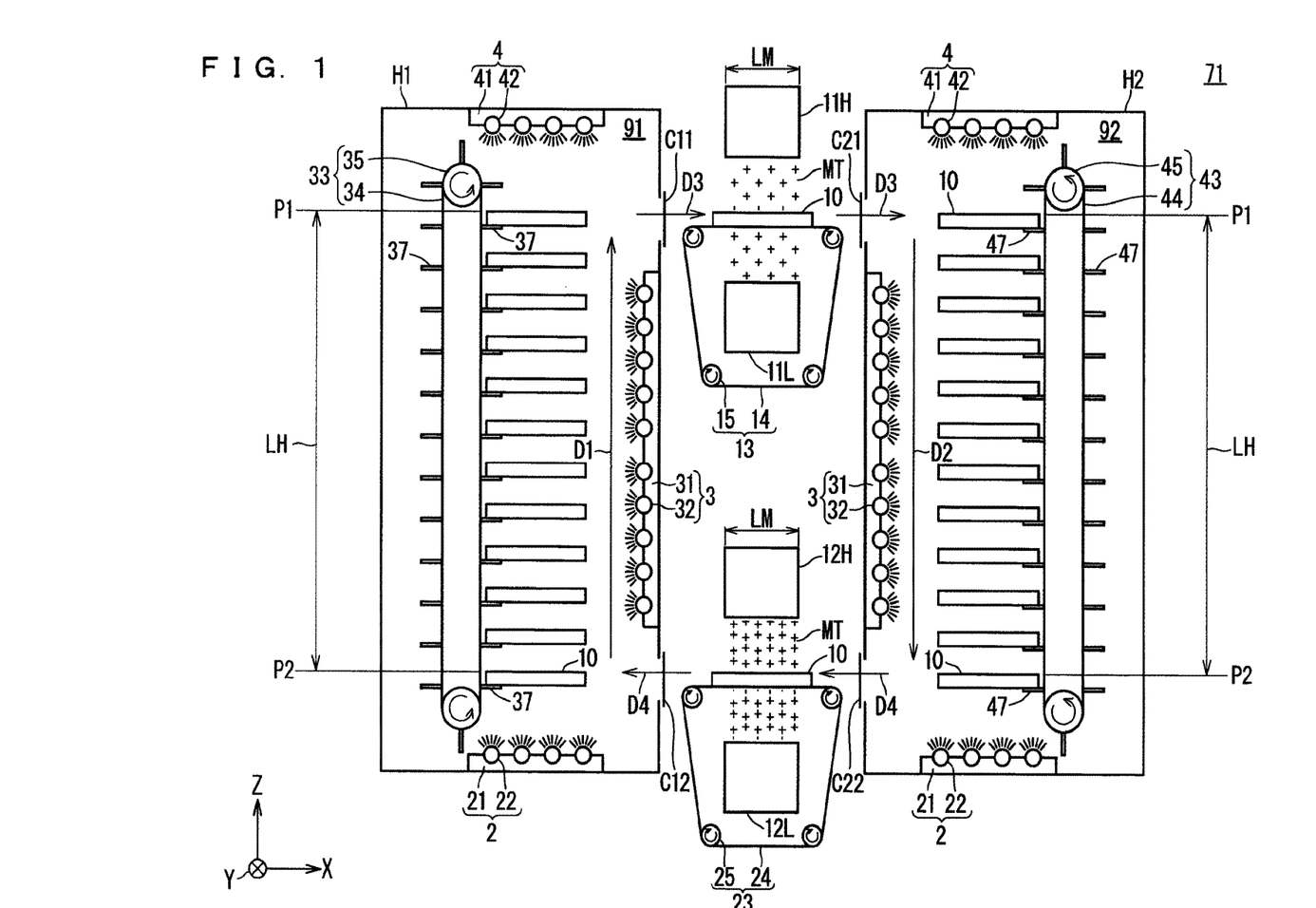
FIG. 1 is an explanatory diagram schematically illustrating a cross-sectional structure of a film forming apparatus being an embodiment of the present invention.

FIG. 1 is an explanatory diagram schematically illustrating a cross-sectional structure of a film forming apparatus 71 being an embodiment of the present invention. An XYZ orthogonal coordinate system is illustrated in FIG. 1.

As illustrated in FIG. 1, the film forming apparatus 71 of this embodiment includes heating chambers H1 and H2, thin film forming nozzles 11H and 11L, and thin film forming nozzles 12H and 12L.

Inside the heating chamber H1, a conveyor 33 and substrate holding members 37 serving as a first heating moving mechanism are provided. The conveyor 33 includes a pair of rollers 35 for conveyance provided at both upper and lower ends, and an endless belt 34 for conveyance that is stretched across the pair of rollers 35. Further, a plurality of substrate holding members 37 are provided on the belt 34 so as to be spaced apart from each other at predetermined intervals.

Each substrate holding member 37 is provided in a manner of projecting perpendicularly to the belt 34, and a substrate 10 is held on an upper surface of the substrate holding member 37. In this case, the substrate 10 is held by the substrate holding member 37 so that a front surface and a back surface of the substrate 10 are in parallel with the X direction.

Although the illustration of FIG. 1 is only schematic, the shape of the substrate holding member 37 is elongated so that the substrate holding member 37 reaches the center portion of the substrate 10, and the substrate holding member 37 is provided with a retaining function to retain the substrate 10, in such a manner that the substrate holding member 37 stably holds the substrate 10.

Therefore, the conveyor 33 holds a predetermined number (two or more) of substrates 10 and simultaneously moves the predetermined number of substrates 10 in a substrate moving direction D1, by means of a part of the plurality of substrate holding members 37 (in FIG. 1, a predetermined number of substrate holding members 37 provided on the right side of the belt 34 of the conveyor 33).

Further, the heating chamber H1 includes infrared radiation apparatuses 2 to 4 in its inside, as a first heating mechanism. The infrared radiation apparatus 2 is provided on a bottom surface of the heating chamber H1, the infrared radiation apparatus 3 is provided on a right side surface of the heating chamber H1, and the infrared radiation apparatus 4 is provided on an upper surface of the heating chamber H1.

The infrared radiation apparatus 2 consists of a lamp placing table 21 and a plurality of infrared lamps 22. The plurality of infrared lamps 22 are attached to an upper portion of the lamp placing table 21. Therefore, the infrared radiation apparatus 2 can radiate infrared light upward (+Z direction) from the plurality of infrared lamps 22. With the above-mentioned infrared radiation of the infrared radiation apparatus 2, heating treatment (first direction heating treatment) for back surfaces of the predetermined number of substrates 10 held by the substrate holding members 37 can be performed.

The infrared radiation apparatus 4 consists of a lamp placing table 41 and a plurality of infrared lamps 42. The plurality of infrared lamps 42 are attached to a lower portion of the lamp placing table 41. Therefore, the infrared radiation apparatus 4 can radiate infrared light downward (−Z direction) from the plurality of infrared lamps 42. With the above-mentioned infrared radiation of the infrared radiation apparatus 4, heating treatment (second direction heating treatment) for front surfaces of the predetermined number of substrates 10 held by the substrate holding members 37 can be performed.

The infrared radiation apparatus 3 consists of a lamp placing table 31 and a plurality of infrared lamps 32. The plurality of infrared lamps 32 are attached to a left portion of the lamp placing table 31. Therefore, the infrared radiation apparatus 3 can radiate infrared light leftward (−X direction) from the plurality of infrared lamps 32. With the above-mentioned infrared radiation of the infrared radiation apparatus 3, heating treatment (third direction heating treatment) for right side surfaces of the predetermined number of substrates 10 held by the substrate holding members 37 can be performed.

As described above, the first heating mechanism of the film forming apparatus 71 includes three infrared radiation apparatuses 2 to 4 (plurality of heating units), and the three infrared radiation apparatuses 2 to 4 radiate infrared light along three different radiation directions (+Z direction, −Z direction, and −X direction). In this manner, temperature distribution in a heating space 91 can be made uniform.

With rotational drive of the pair of rollers 35, the conveyor 33 can move a right side (+X direction side) of the belt 34 along the substrate moving direction D1 (+Z direction; first direction), Accordingly, the substrate moving direction D1 corresponds to an ascending direction.

Therefore, the conveyor 33 can move the predetermined number of substrates 10 held by the predetermined number of substrate holding members 37 along the substrate moving direction D1, in conjunction with the movement of the belt 34 described above. Specifically, when a surface position of each substrate 10 in an initial state is defined as a position P2 (second position), the conveyor 33 can move the substrates 10 in such a manner that the surface position of each substrate 10 is moved from the position P2 to reach an upper position P1 (first position).

In this manner, the conveyor 33 of the first heating moving mechanism performs first heating treatment on the substrates 10 by moving the substrates 10 in the substrate moving direction D1 (first direction) inside the heating space 91 (first heating space) where temperature distribution is uniform.

In this case, as described above, the heating space 91 is set to uniform temperature distribution owing to the infrared radiation apparatuses 2 to 4 serving as a first heating mechanism. Therefore, the predetermined number of substrates 10 can be heated more uniformly in the heating space 91.

Meanwhile, inside the heating chamber H2, a conveyor 43 and substrate holding members 47 serving as a second heating moving mechanism are provided. The conveyor 43 includes a pair of rollers 45 for conveyance provided at both upper and lower ends, and an endless belt 44 for conveyance that is stretched across the pair of rollers 45. Further, a plurality of substrate holding members 47 are provided on the belt 44 so as to be spaced apart from each other at predetermined intervals.

Each substrate holding member 47 is provided in a manner of projecting perpendicularly to the belt 44, and a substrate 10 is held on an upper surface of the substrate holding member 47. In this case, the substrate 10 is held by the substrate holding member 47 so that a front surface and a back surface of the substrate 10 are in parallel with the X direction.

Although the illustration of FIG. 1 is only schematic, the shape of the substrate holding member 47 is elongated so that the substrate holding member 47 reaches the center portion of the substrate 10, and the substrate holding member 47 is provided with a retaining function to retain the substrate 10, in such a manner that the substrate holding member 47 stably holds the substrate 10.

Therefore, the conveyor 43 holds a predetermined number (two or more) of substrates 10 and simultaneously moves the predetermined number of substrates 10 in a substrate moving direction D2, by means of a part of the plurality of substrate holding members 47 (in FIG. 1, a predetermined number of substrate holding members 47 provided on the left side of the belt 44 of the conveyor 43). The substrate moving direction D2 (−Z direction) is a direction opposite to the substrate moving direction D1 (+Z direction), and corresponds to a descending direction.

Meanwhile, the heating chamber H2 includes infrared radiation apparatuses 2 to 4 in its inside, as a second heating mechanism. The infrared radiation apparatus 2 is provided on a bottom surface of the heating chamber H2, the infrared radiation apparatus 3 is provided on a left side surface of the heating chamber H2, and the infrared radiation apparatus 4 is provided on an upper surface of the heating chamber H2.

The infrared radiation apparatuses 2 and 4 provided inside the heating chamber H2 are similar to the infrared radiation apparatuses 2 and 4 provided inside the heating chamber H1, and are thus denoted by the same reference signs to omit description thereof.

The infrared radiation apparatus 3 consists of a lamp placing table 31 and a plurality of infrared lamps 32. The plurality of infrared lamps 32 are attached to a left portion of the lamp placing table 31. Therefore, the infrared radiation apparatus 3 can radiate infrared light rightward (+X direction) from the plurality of infrared lamps 32. With the above-mentioned infrared radiation of the infrared radiation apparatus 3, heating treatment (third direction heating treatment) for left side surfaces of the predetermined number of substrates 10 held by the substrate holding members 47 can be performed.

As described above, the second heating mechanism of the film forming apparatus 71 includes three infrared radiation apparatuses 2 to 4 (plurality of heating units), and the three infrared radiation apparatuses 2 to 4 radiate infrared light along, three different radiation directions (+Z direction, −Z direction, and +X direction). In this manner, temperature distribution in a heating space 92 can be made uniform.

With rotational drive of the pair of rollers 45, the conveyor 43 can move a left side (−X direction side) of the belt 44 along the substrate moving direction D2 (−Z direction; second direction).

Therefore, the conveyor 43 can move the predetermined number of substrates 10 held by the predetermined number of substrate holding members 47 along the substrate moving direction D2, in conjunction with the movement of the belt 44 described above. Specifically, when a surface position of each substrate 10 in an initial state is defined as a position P1 (first position), the conveyor 43 can move the substrates 10 in such a manner that the surface position of each substrate 10 is moved from the position P1 to reach a lower position P2 (second position).

In this manner, the conveyor 43 of the second heating moving mechanism performs second heating treatment on the substrates 10 by moving the substrates 10 in the substrate moving direction D2 (second direction) inside the heating space 92 (second heating space) where temperature distribution is uniform.

In this case, as described above, the heating space 92 is set to uniform temperature distribution owing to the infrared radiation apparatuses 2 to 4 serving as a second heating mechanism. Therefore, the predetermined number of substrates 10 can be heated more uniformly in the heating space 92.

In the film forming apparatus 71, two conveyors 13 and 23 are provided between the heating chambers H1 and H2.

The conveyor 13 serving as a first conveyance moving mechanism includes four rollers 15 for conveyance provided at four end portions so as to surround the thin film forming nozzle 11L to be described later in detail, and an endless belt 14 for conveyance that is stretched across the four rollers 15.

The conveyor 13 having the configuration described above allows the substrate 10 to be placed on an upper surface of the belt 14, and simultaneously conveys the substrate 10 along a conveying direction D3 being a first conveying direction (+X direction). A surface position of the substrate 10 placed on the upper surface of the belt 14 in the Z direction is set to be substantially level with the position P1. Note that the conveyor 13 can allow at least one substrate 10 to be placed on the belt 14.

Specifically, with rotational drive of the four rollers 15, the conveyor 13 can move an upper side (+Z direction side) of the belt 14 along the conveying direction D3. As a result, the conveyor 13 can perform conveyance processing (first conveyance processing) of conveying the substrate 10 along the conveying direction D3 (first conveying direction) from the heating chamber H1 toward the heating chamber H2.

The thin film forming nozzle 11L serving as a first direction mist spraying unit of a first mist spraying mechanism is fixedly disposed by a fixing means (not shown) so as to be located below an upper side of the belt 14, located above a lower side of the belt 14, located on the right of a left side of the belt 14, and located on the left of a right side of the belt 14. In this case, the thin film forming nozzle 11L is disposed to have such a positional relationship that its mist spray port faces a back surface of the substrate 10 disposed on the belt 14.

The thin film forming nozzle 11H serving as a second direction mist spraying unit of the first mist spraying mechanism is fixedly disposed by a fixing means (not shown) so as to be located further above the upper side of the belt 14. In this case, the thin film forming nozzle 11H is disposed to have such a positional relationship that its mist spray port and a front surface of the substrate 10 disposed on the belt 14 face each other.

The thin film forming nozzle 11L performs first direction mist spraying treatment of spraying source mist MT upward (+Z direction; first direction) from the mist spray port.

The thin film forming nozzle 11H performs second direction mist spraying treatment of spraying source mist MT downward (−Z direction; second direction) from the mist spray port.

As described above, the film forming apparatus 71 of the first this embodiment includes the thin film forming nozzle 11L as the first direction mist spraying unit of the first mist spraying mechanism, and the thin film forming nozzle 11H as the second direction mist spraying unit of the first mist spraying mechanism. Therefore, in the film forming apparatus 71 of this embodiment, a combination of the thin film forming nozzles 11L and 11H constitutes the first mist spraying mechanism. The first mist spraying mechanism performs first mist spraying treatment consisting of a combination of the first direction mist spraying treatment and the second direction mist spraying treatment.

Of a conveyance path in which the substrate 10 is conveyed in the conveying direction D3 by the conveyor 13, a path in which the source mist MT is sprayed corresponds to a first film forming path.

Therefore, the conveyor 13 serving as a first conveyance moving mechanism performs first conveyance processing of moving the substrate 10 along the conveying direction D3, to thereby cause the substrate 10 to pass through the first film forming path outside the heating chambers H1 and H2, and convey the substrate 10 between the heating chambers H1 and H2.

Note that, to enable the first conveyance processing, first and second transfer processings described below are required, using a substrate transfer mechanism such as robot arms (not shown). The first transfer processing is processing of transferring the substrate 10, which is held by the substrate holding member 37 inside the heating chamber H1 and whose surface position is located at the position P1, to a left end of the upper surface of the belt 14. The second transfer processing is processing of transferring the substrate 10, which is placed on a right end of the upper surface of the belt 14, and causing the substrate holding member 47 to hold the substrate 10 so that the surface position is located at the position P1 inside the heating char giber H2.

Note that, when the first transfer processing is performed, a gate C11 provided on a right side surface of the heating chamber H1 so as to correspond to the position P1 is opened, and when the second transfer processing is performed, a gate C21 provided on a left side surface of the heating chamber H2 at the position P1 is opened.

Therefore, a combination of the conveyor 13 and the substrate transfer mechanism described above constitutes the first conveyance moving mechanism. In the following, for the sake of convenience in description, description of the first and second transfer processings is omitted, and second conveyance processing performed by the conveyor 13 will be described instead.

The thin film forming nozzles 11H and 11L serving as a first mist spraying mechanism perform the first mist spraying treatment of spraying the source mist MT, which is obtained by atomizing a source solution, toward the substrate 10 passing through the first film forming path.

The conveyor 23 serving as a second conveyance moving mechanism includes four rollers 25 for conveyance provided at four end portions so as to surround the thin film forming nozzle 12L to be described later in detail, and an endless belt 24 for conveyance that is stretched across the four rollers 25.

The conveyor 23 having the configuration described above allows the substrate 10 to be placed on an upper surface of the belt 24, and simultaneously conveys the substrate 10 along a conveying direction D4 being a second conveying direction (−X direction). A surface position of the substrate 10 placed on the upper surface of the belt 24 in the Z direction is set to be substantially level with the position P2. Note that at least one substrate 10 can be placed on the belt 24.

Specifically, with rotational drive of the four rollers 25, the conveyor 23 can move an upper side (+Z direction side) of the belt 24 along the conveying direction D4. As a result, the conveyor 23 can perform conveyance processing (second conveyance processing) of conveying the substrate 10 along the conveying direction D4 (second conveying direction) from the heating chamber H2 toward the heating chamber H1.

The thin film forming nozzle 12L serving as a first direction mist spraying unit of a second mist spraying mechanism is fixedly disposed by a fixing means (not shown) so as to be located below an upper side of the belt 24, located above a lower side of the belt 24, located on the right of a left side of the belt 24, and located on the left of a right side of the belt 24. In this case, the thin film forming nozzle 12L is disposed to have such a positional relationship that its mist spray port faces a back surface of the substrate 10 disposed on the belt 24.

The thin film forming nozzle 12H serving as a second direction mist spraying unit of the second mist spraying mechanism is fixedly disposed by a fixing means (not shown) so as to be located further above the upper side of the belt 24. In this case, the thin film forming nozzle 12H is disposed to have such a positional relationship that its mist spray port and a front surface of the substrate 10 disposed on the belt 24 face each other.

The thin film forming nozzle 12L performs first direction mist spraying treatment of spraying source mist MT upward (+Z direction; first direction) from the mist spray port.

The thin film forming nozzle 12H performs second direction mist spraying treatment of spraying source mist MT downward (−Z direction; second direction) from the mist spray port.

As described above, the film forming apparatus 71 of this embodiment includes the thin film forming nozzle 12L as the first direction mist spraying unit of the second mist spraying mechanism, and the thin film forming nozzle 12H as the second direction mist spraying unit of the second mist spraying mechanism. Therefore, in the film forming apparatus 71 of this embodiment, a combination of the thin film forming nozzles 12L and 12H constitutes the second mist spraying mechanism. The second mist spraying mechanism performs second mist spraying treatment consisting of a combination of the first direction mist spraying treatment and the second direction mist spraying treatment.

Of a conveyance path in which the substrate 10 is conveyed in the conveying direction D4 by the conveyor 23, a path in which the source mist MT is sprayed corresponds to a second film forming path.

Therefore, the conveyor 23 serving as a second conveyance moving mechanism performs second conveyance processing of moving the substrate 10 along the conveying direction D4, to thereby cause the substrate 10 to pass through the second film forming path outside the heating chambers H1 and H2, and convey the substrate 10 between the heating chambers H1 and H2.

Note that, to enable the second conveyance processing, third and fourth transfer processings described below are required, using a substrate transfer mechanism such as robot arms (not shown). The third transfer processing is processing of transferring the substrate 10, which is held by the substrate holding member 47 inside the heating chamber H2 and whose surface position is located at the position P2, to a right end of the upper surface of the belt 24. The fourth transfer processing is processing of transferring the substrate 10, which is placed on a left end of the upper surface of the belt 24, and causing the substrate holding member 37 to hold the substrate 10 so that the surface position is located at the position P2 inside the heating chamber H1.

Note that, when the third transfer processing is performed, a gate C22 provided on a left side surface of the heating chamber H2 at the position P2 is opened, and when the fourth transfer processing is performed, a gate C12 provided on a right side surface of the heating chamber H1 at the position P2 is opened.

Therefore, a combination of the conveyor 23 and the substrate transfer mechanism described above constitutes the second conveyance moving mechanism. In the following, for the sake of convenience in description, description of the third and fourth transfer processings is omitted, and second conveyance processing performed by the conveyor 23 will be described instead.

The thin film forming nozzles 12H and 11L serving as a second mist spraying mechanism perform the second mist spraying treatment of spraying the source mist MT, which is obtained by atomizing a source solution, toward the substrate 10 passing through the second film forming path.

Note that it is desirable that each of the belt 14 of the conveyor 13 and the belt 24 of the conveyor 23 be formed of a combination of a pair of linear conveyor chains, and have a structure including an opening portion through which the source mist MT passes. This is because the presence of the belts 14 and 24 does not adversely affect spraying of the source mist MT of the thin film forming nozzles 11L and 12L.

(Operation)

Figure 2:
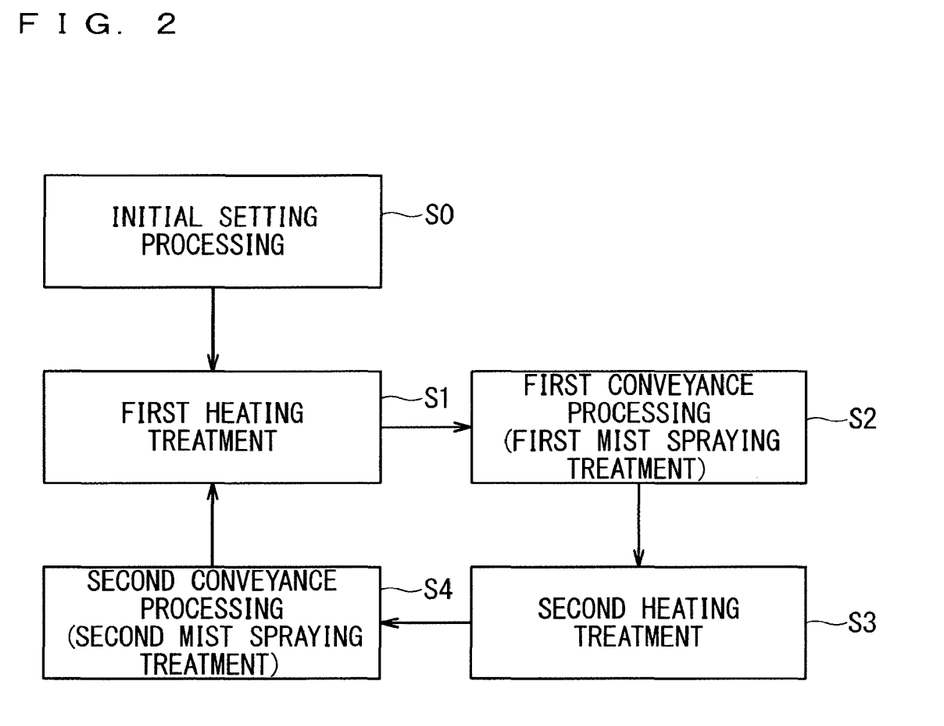
FIG. 2 is an explanatory diagram schematically illustrating a thin film forming processing procedure of the film forming apparatus of the embodiment.

FIG. 2 is an explanatory diagram schematically illustrating a thin film forming processing procedure of the film forming apparatus 71 of this embodiment. With reference to FIG. 2, details of the film forming processing performed by the film forming apparatus 71 will be described below. Note that, in the following, for the sake of convenience in description, film forming processing for one substrate 10 will be described.

First, in Step S0, initial setting processing is performed. Specifically, inside the heating chamber H1, the substrate holding member 37 is caused to hold the substrate 10 so that a surface position of the substrate 10 is located at the position P2.

Next, in Step S1, first heating treatment is performed. Specifically, inside the heating chamber H1, in a state in which the heating space 91 is set to a predetermined temperature by the infrared radiation apparatuses 2 to 4 serving as a first heating mechanism, the substrate 10 is held and simultaneously the substrate 10 is moved along the substrate moving direction D1 by the conveyor 33 and the substrate holding member 37 serving as a first heating moving mechanism. In this manner, the first heating treatment is performed. After Step S1 is performed, the surface position of the substrate 10 inside the heating chamber H1 is located at the position P1.

Subsequently, in Step S2, first conveyance processing (first mist spraying treatment) is performed. The first conveyance processing is processing of moving the substrate 10 along the conveying direction D3 by the conveyor 13 being a main component of the first conveyance moving mechanism, to thereby cause the substrate 10 to pass through the first film forming path outside the heating chambers H1 and H2, and convey the substrate 10 between the heating chambers H1 and H2. First mist spraying treatment is performed in parallel with the first conveyance processing.

The first mist spraying treatment is treatment of spraying the source mist MT, which is obtained by atomizing a source solution, toward the substrate 10 passing through the first film forming path by the thin film forming nozzles 11H and 11L serving as a first mist spraying mechanism. After Step S2 is performed, the surface position of the substrate 10 inside the heating chamber H2 is located at the position P1.

After the first heating treatment is performed in Step S1, a set of film forming treatment for forming a thin film on a front surface and a back surface of the substrate 10 by performing the first mist spraying treatment of Step S2 can be performed.

Subsequently, in Step S3, second heating treatment is performed. Specifically, inside the heating chamber H2, in a state in which the heating space 92 is set to a predetermined temperature by the infrared radiation apparatuses 2 to 4 serving as a second heating mechanism, the substrate 10 is held and simultaneously the substrate 10 is moved along the substrate moving direction D2 by the conveyor 43 and the substrate holding member 47 serving as a second heating moving mechanism. In this manner, the second heating treatment is performed. After Step S3 is performed, the surface position of the substrate 10 inside the heating chamber 112 is located at the position P2.

Subsequently, in Step S4, second conveyance processing (second mist spraying treatment) is performed. The second conveyance processing is processing of moving the substrate 10 along the conveying direction D4 by the conveyor 23 being a main component of the second conveyance moving mechanism, to thereby cause the substrate 10 to pass through the second film forming path outside the heating chambers H1 and H2, and convey the substrate 10 between the heating chambers H1 and H2. Second mist spraying treatment is performed in parallel with the second conveyance processing.

The second mist spraying treatment is treatment of spraying the source mist MT, which is obtained by atomizing a source solution, toward the substrate 10 passing through the second film forming path by the thin film forming nozzles 12H and 12L serving as a second mist spraying mechanism. After Step S4 is performed, the surface position of the substrate 10 inside the heating chamber H1 is located at the position P2.

After the second heating treatment is performed in Step S3, a set of film forming treatment for forming a thin film on a front, surface and a back surface of the substrate 10 by performing the second mist spraying treatment of Step S4 can be performed.

After Step S4 is completed, the substrate 10 is held by the substrate holding member 37 so that the surface position is located at the position P2 inside the heating chamber H1, which brings the processing back to the same state as the initial setting of Step S0. Therefore, processing of Steps S1 to S4 can be repeated without performing the initial setting processing consisting of Step S0 again.

Here, a series of processing performed in the order of Step S1 (first heating treatment), Step S2 (first conveyance processing), Step S3 (second heating treatment), and Step S4 (second conveyance processing) is a basic cycle of the film forming apparatus 71.

Therefore, the film forming apparatus 71 of this embodiment can perform the basic cycle at least once, and if necessary, the film forming apparatus 71 can repeat the basic cycle N (N≥2) times.

Note that, in Steps S0 to S4 described above, for the sake of convenience in description, description is given based on the assumption that one substrate 10 is subjected to film formation. However, as a matter of course, Steps S0 to S4 (Steps S1 to S4 in the second and subsequent cycles) can be performed on a plurality of substrates 10 in parallel. For example, a part of a plurality of substrates 10 can be subjected to the first heating of Step S1, another part thereof can be subjected to the first conveyance processing of Step S2, yet another part thereof can be subjected to the second heating of Step S3, and the rest thereof can be subjected to the second conveyance processing of Step S4.

(Effects Etc.)

The film forming apparatus 71 of this embodiment can perform the basic cycle consisting of Steps S1 to S4 as described above.

Therefore, a set of film forming treatment for forming a thin film on each of a front surface and a back surface of the substrate 10 can be performed by performing the first mist spraying treatment of Step S2 after performing the first heating treatment of Step S1 In addition, after the second heating treatment of Step S3 is performed, a set of film forming treatment for forming a thin film on a front surface and a back surface of the substrate 10 can be performed by performing the second mist spraying treatment of Step S4.

Therefore, as in Step S0 illustrated in FIG. 2, once the initial setting of disposing the substrate 10 at the position P2 inside the heating chamber H1 is performed, the basic cycle can be performed at least once subsequently to Step S0.

Thus, the film forming apparatus 71 of this embodiment can perform two sets of film forming treatment within one basic cycle. Further, by repeating the basic cycles N (N≥2) times, 2·N sets of film forming treatment can be performed with high throughput.

In this manner, the film forming apparatus 71 of this embodiment can perform 2·N sets of film forming treatment with high throughput by repeating the basic cycle N times, with a minimum necessary configuration including the heating chambers H1 and H2, the conveyors 33 and 43, the substrate holding members 37 and 47, the conveyors 13 and 23, the thin film forming nozzles 11H and 11L, and the thin film forming nozzles 12H and 12L.

The film forming apparatus 71 of this embodiment performs the first heating treatment by moving the substrate 10 along the substrate moving direction D1 being a first direction inside the heating space 91 being a first heating space, and performs the second heating treatment by moving the substrate 10 along the substrate moving direction D2 being a second direction inside the heating space 92 being a second heating space.

Therefore, the film forming apparatus 71 can uniformly heat the substrate 10, irrespective of the shape of the substrate 10.

Further, in the film forming apparatus 71 of this embodiment, each of the heating chambers H1 and H2, and each of the first and second film forming paths provided outside the heating chambers H1 and H2 are disposed separately from each other. Therefore, the first and second mist spraying treatments do not adversely affect the first and second heating treatments.

Therefore, the film forming apparatus 71 of this embodiment can form a thin film on a front surface and a back surface of the substrate 10, without reducing film forming quality and a film forming rate.

Further, the film forming apparatus 71 of this embodiment performs the first and second mist spraying treatments on the substrate passing through the first and second film forming paths while the film forming apparatus 71 performs the first and second conveyance processings of moving the substrate 10 between the heating chambers H1 and H2. As a result, the film forming apparatus 71 can efficiently perform the first and second mist spraying treatments.

Further, in the film forming apparatus 71, the substrate moving direction D2 being a second direction is a direction opposite to the substrate moving direction D1 being a first direction, and the conveying directions D3 and D4 are directions perpendicular to the substrate moving directions D1 and D2.

Therefore, the conveyor 33 inside the heating chamber H1 ascends the surface position of the substrate 10 from the position P2 to the position P1 while the conveyor 33 performs the first heating treatment performed in Step S1, and can thus relatively easily move the substrate 10 on an extended line of the conveying direction D3.

In a similar manner, the conveyor 43 inside the heating chamber H2 descends the surface position of the substrate 10 from the position P1 to the position P2 while the conveyor 43 performs the second heating treatment performed in Step S3, and can thus relatively easily move the substrate 10 on an extended line of the conveying direction D4.

Further, the substrate moving direction D1 and the substrate moving direction D2 are directions (Z direction) perpendicular to the surface of the substrate 10, and the conveying directions D3 and D4 are directions (X direction) in parallel with the surface of the substrate 10.

Therefore, each of the heating chambers H1 and H2 of the film forming apparatus 71 can be formed into a columnar shape, with its surface that can accommodate the substrate 10 being a bottom surface, and the substrate moving direction D1 (D2) being a height direction. Thus, the area of the apparatus can be reduced.

For example, if the shape of the surface of the substrate 10 is circular, each of the heating chambers H1 and H2 can be formed into a cylindrical shape.

Further, the first mist spraying mechanism of the film forming apparatus 71 of this embodiment performs the first direction mist spraying treatment performed by the thin film forming nozzle 11L and the second direction mist spraying treatment performed by the thin film forming nozzle 11H at the same time. In this manner, the first mist spraying mechanism can form a thin film on each of a back surface and a front surface of the substrate 10 when the first mist spraying mechanism performs the first conveyance processing (first mist spraying treatment) of Step S2.

In a similar manner, the second mist spraying mechanism of the film forming apparatus 71 of this embodiment performs the first direction mist spraying treatment performed by the thin film forming nozzle 12L and the second direction mist spraying treatment performed by the thin film forming nozzle 12H at the same time. In this manner, the second mist spraying mechanism can form a thin film on each of a back surface and a front surface of the substrate 10 when the second mist spraying mechanism performs the second conveyance processing (second mist spraying treatment) of Step S4.

Further, the film forming apparatus 71 of the embodiment performs the first heating treatment, the first conveyance processing (first mist spraying treatment), the second heating treatment, and the second conveyance processing (second mist spraying treatment) on a plurality of substrates 10 in parallel. Accordingly, the film forming apparatus 71 can enhance throughput of the film forming treatment even further.

(Heating Process Length LH and Film Forming Process Length LM)

The first and second heating treatments performed inside the heating chambers H1 and H2 will be analyzed. The first heating treatment performed inside the heating chamber H1 and the first conveyance processing (first mist spraying treatment) performed in the first film forming path will be analyzed below, based on the assumption that heating conditions required in the first and second heating treatments are the same, and that film forming conditions required in the first and second conveyance processings are the same.

A case where necessary heating time TH is required to perform the first heating treatment performed in Step S1 illustrated in FIG. 2, and necessary mist spraying time TM is required to perform for the first mist spraying treatment performed in Step S2 is considered. Specifically, the considered case is one where a desired thin film can be formed with high quality, by performing the heating treatment of the necessary heating time TH, and then performing the mist spraying treatment of the necessary mist spraying time TM.

A distance from the position P1 to the position P2 in the heating chamber H1 is defined as a heating process length LH, a formation length of the first film forming path in which spraying of the source mist MT is performed out of the first conveyance path along the conveying direction D3 is defined as a film forming process length LM, a moving speed of the substrate 10 along the substrate moving direction D1 with the conveyor 33 is defined as a heating moving speed VH, and a moving speed of the substrate 10 with the conveyor 13 is defined as a conveyance moving speed VM.

In the film forming apparatus 71 of this embodiment, the heating process length LH and the heating moving speed VH are set to satisfy the necessary heating time TH. Specifically, the heating process length LH and the heating moving speed VH are set to satisfy Formula (1) $\{LH/VH=TH\ (1)\}$.

For example, if the necessary heating time TH for the substrate 10 to reach a target temperature inside the heating space 91 that has been heated to a predetermined temperature is 10 seconds, and if the heating moving speed VH is 10 cm/s, the heating process length LH may be set to 100 cm.

In a similar manner, in the film forming apparatus 71 of this embodiment, the film forming process length LM and the conveyance moving speed VM are set to satisfy the necessary mist spraying time TM. Specifically, the film forming process length LM and the conveyance moving speed VM are set to satisfy Formula (2) {LM/VM=TM . . . (2)}.

In this manner, in the film forming apparatus 71 of this embodiment, the heating process length LH and the heating moving speed VH are set to satisfy Formula (1), and the film forming process length LM and the conveyance moving speed VM are set to satisfy Formula (2).

Therefore, the film forming apparatus 71 of this embodiment can perform the first and second heating treatments so that the temperature of the substrate 10 reaches a target temperature, without unnecessarily increasing a setting temperature of the heating spaces 91 and 92 of the heating chambers H1 and H2.

Further, the film forming apparatus 71 can accurately form a thin film having a target film thickness, without unnecessarily increasing a spray amount of source mist in the first and second mist spraying treatments performed by the thin film forming nozzles 11H and 11L and the thin film forming nozzles 12H and 12L.

Further, in the film forming apparatus 71 of this embodiment, when the number of times of repeated performance of the basic cycle consisting of Steps S1 to S4 of FIG. 2 is defined as the number of cycles, the number of cycles is set to such number that a film thickness of a thin film to be formed on each of a front surface and a back surface of the substrate 10 reaches a predetermined film thickness.

Therefore, a thin film having a predetermined film thickness can be formed on each of a front surface and a back surface of the substrate 10, without increasing the scale of the film forming apparatus 71.

Additional Notes

In the embodiment described above, the first and second conveyance moving mechanisms and the first and second mist spraying mechanisms are illustrated. However, this structure ay be simplified as one conveyance moving mechanism and one mist spraying mechanism.

For example, a combination structure of the thin film forming nozzles 11H and 11L and the conveyor 13 may be further provided with an elevating mechanism for causing elevation in the vertical direction (+Z direction, −Z direction). In this case, the combination structure is moved to a position near the position P1 or the position P2 as necessary by the elevating mechanism. In this manner, the function of the thin film forming nozzles 12H and 12L and the conveyor 23 can be assigned to the combination structure.

In this case, when the conveyor 13 of the combination structure is located near the position P1, the conveyor 13 can enable performance of first film forming treatment described below by performing conveyance processing along the conveying direction D3, and when the conveyor 13 is located near the position P2, the conveyor 13 can enable performance of second film forming treatment described below by performing conveyance processing along the conveying direction D4.

The first film forming treatment is treatment of performing spraying treatment of the source mist MT with the thin film forming nozzles 11H and 11L of the combination structure, after the first heating treatment inside the heating chamber H1 is performed. The second film forming treatment is treatment of performing spraying treatment of the source mist MT with the thin film forming nozzles 11H and 11L of the combination structure, after the second heating treatment inside the heating chamber H2 is performed.

Further, in this embodiment, the substrate moving directions D1 and D2 are set to directions perpendicular to the surface of the substrate 10, and the conveying directions D3 and D4 are set to directions in parallel with the surface of the substrate. As a modification of the embodiment, the substrate moving directions D1 and D2 may be set to directions in parallel with the surface of the substrate 10, and the conveying directions D3 and D4 may be set to directions perpendicular to the surface of the substrate. Note that, in this case, how the thin film forming nozzles 11H and 11L and the thin film forming nozzles 12H and 12L should be disposed needs consideration.

Further, in this embodiment, the infrared radiation apparatuses 2 to 4 are illustrated as each of the first and second heating mechanisms, but this is not restrictive. Other heating units can be substituted for the infrared radiation apparatuses 2 to 4 as long as such heating units heat the heating spaces 91 and 92 to a predetermined temperature.

Further, in this embodiment, the thin film forming nozzles 11H and 11L, the thin film forming nozzles 12H and 12L, the conveyor 13, and the conveyor 23 may be present outside the heating chambers H1 and H2. For example, as with the film forming chambers 901 and 902 illustrated in FIG. 3, the thin film forming nozzles 11H and 11L and the conveyor 13 may be accommodated in a film forming chamber closed off from the outside, and the thin film forming nozzles 12H and 12L and the conveyor 23 may be accommodated in a film forming chamber closed off from the outside.

While the invention has been shown and described in detail, the foregoing description is in all aspects illustrative and not restrictive. It is therefore understood that numerous unillustrated modifications and variations can be devised without departing from the scope of the invention.

The invention claimed is:

1. A film forming apparatus comprising:
first and second heating chambers including first and second heating spaces;
first and second heating conveyors provided in said first and second beating spaces, said first heating conveyor performing first heating treatment by moving a substrate in a first direction inside said first heating space, and said second heating conveyor performing second heating treatment by moving said substrate in a second direction inside said second heating space;
a conveyor between said first and second heating chambers configured to perform conveyance processing of moving said substrate along a conveying direction, to thereby cause the substrate to pass through a film forming path outside said first and second heating chambers, and convey said substrate between the first and second heating chambers; and
a mist sprayer configured to perform mist spraying treatment of spraying source mist toward said substrate passing through said film forming path, the source mist being obtained by atomizing a source solution, wherein
at least part of said mist sprayer is provided in said conveyor, and
after at least one heating treatment of said first and second heating treatments is performed, a thin film is formed on said substrate by performing said mist spraying treatment with said mist sprayer.

2. The film forming apparatus according to claim 1, wherein
said second direction is a direction opposite to said first direction, and
said conveying direction is a direction perpendicular to said first and second directions.

3. The film forming apparatus according to claim 2, wherein
the first and second directions are directions perpendicular to a surface of said substrate, and
said conveying direction is a direction in parallel with the surface of said substrate.

4. The film forming apparatus according to claim 3, wherein
said first direction is an ascending direction from a lower side toward an upper side, and said second direction is a descending direction from the upper side toward the lower side,
said film forming path includes first and second film forming paths having same formation lengths, said first and second film forming paths are provided at first and second positions different from each other in said first direction, the first and second film forming paths do not overlap each other, and said first position has such a positional relationship that the first position is located higher than said second position in said first direction,
said conveying direction includes first and second conveying directions, said first conveying direction is a direction from said first heating chamber toward said second heating chamber, and said second conveying direction is a direction from said second heating chamber toward said first heating chamber,
said conveyor between heating chambers includes first and second conveyors between heating chambers,
said first conveyor between heating chambers performs first conveyance processing of moving said substrate from said first heating chamber to said second heating chamber along said first conveying direction, said substrate is passed through said first film forming path,
said second conveyor between heating chambers performs second conveyance processing of moving said substrate from said second heating chamber to said first heating chamber along said second conveying direction, said substrate is passed through said second film forming path, and said conveyance processing includes said first and second conveyance processings,
said mist sprayer includes first and second mist sprayers, said first mist sprayer performs first mist spraying treatment of spraying toward said substrate passing through said first film forming path, said second mist sprayer performs second mist spraying treatment of spraying toward said substrate passing through said second film forming path, and said mist spraying treatment includes said first and second mist spraying treatments, and
a basic cycle being a series of processing performed in order of said first heating treatment, said first conveyance processing, said second heating treatment, and said second conveyance processing is performed at least once.

5. The film forming apparatus according to claim 4, wherein
a distance from said first position to said second position in each of said first and second heating chambers is defined as a heating process length, a formation length of said first and second film forming paths is defined as a same film forming process length, a moving speed of said substrate with said first and second heating conveyors is defined as a same heating moving speed, and a moving speed of said substrate with said first and second conveyors between heating chambers is defined as a same conveyance moving speed,
necessary heating time is required to perform said first and second heating treatments, and necessary mist spraying time is required to perform said first and second mist spraying treatments, and
said heating process length and said heating moving speed are set to satisfy said necessary heating time, and said film forming process length and said conveyance moving speed are set to satisfy said necessary mist spraying time.

6. The film forming apparatus according to claim 5, wherein
number of times of repeated performance of said basic cycle is defined as number of cycles, and
said number of cycles is set to such that a film thickness of a thin film reaches a predetermined film thickness.

7. The film forming apparatus according to claim 4, wherein
each of said first and second mist sprayers includes
a first direction mist sprayer configured to perform first direction mist spraying treatment of spraying said source mist toward said first direction, and
a second direction mist sprayer configured to perform second direction mist spraying treatment of spraying said source mist toward said second direction, and
wherein
said at least part of said mist sprayer is said first direction mist sprayer of each of said first and second mist sprayers, and
each of said first and second mist spraying treatments includes said first direction mist spraying treatment and said second direction mist spraying treatment.

8. The film forming apparatus according to claim 1, further comprising:
a first heater provided inside said first heating chamber, the first heater being configured to heat said first heating space without touching said substrate; and
a second heater provided inside said second heating chamber, the second heater being configured to heat said second heating space without touching said substrate, wherein
each of said first and second heaters includes a plurality of partial heaters configured to heat said substrate by radiating infrared light along a plurality of radiation directions different from each other.

9. The film forming apparatus according to claim 1, wherein
said substrate includes a plurality of substrates.

* * * * *